US009293640B2

(12) United States Patent
Hertkorn et al.

(10) Patent No.: US 9,293,640 B2
(45) Date of Patent: Mar. 22, 2016

(54) METHOD FOR PRODUCING AN OPTOELECTRONIC SEMICONDUCTOR CHIP AND OPTOELECTRONIC SEMICONDUCTOR CHIP

(71) Applicant: OSRAM Opto Semiconductors GmbH, Regensburg (DE)

(72) Inventors: Joachim Hertkorn, Alteglofsheim (DE); Lorenzo Zini, Regensburg (DE); Jan-Philipp Ahl, Regensburg (DE); Alexander Frey, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/418,424

(22) PCT Filed: Jun. 11, 2013

(86) PCT No.: PCT/EP2013/062022
§ 371 (c)(1),
(2) Date: Jan. 29, 2015

(87) PCT Pub. No.: WO2014/019752
PCT Pub. Date: Feb. 6, 2014

(65) Prior Publication Data
US 2015/0187985 A1  Jul. 2, 2015

(30) Foreign Application Priority Data
Jul. 31, 2012  (DE) .......... 10 2012 107 001

(51) Int. Cl.
*H01L 33/00* (2010.01)
*H01L 29/04* (2006.01)
(Continued)

(52) U.S. Cl.
CPC .......... *H01L 33/007* (2013.01); *H01L 21/0242* (2013.01); *H01L 21/0254* (2013.01);
(Continued)

(58) Field of Classification Search
CPC . H01L 33/0075; H01L 21/0242; H01L 33/32; H01L 21/02381; H01L 21/02458; H01L 21/0254; H01L 21/02647; H01L 33/007; H01L 33/10; H01L 21/02645
USPC ............. 257/98, 88; 438/47, 29, 59, 483, 762
See application file for complete search history.

(56) References Cited

U.S. PATENT DOCUMENTS 6,720,506 B2 *  4/2004  Sahashi ...................... 200/61.73
7,128,786 B2  10/2006  Jurgensen et al.
(Continued)

FOREIGN PATENT DOCUMENTS

DE   102011012608 A1   8/2012
DE   102011114670 A1   4/2013
(Continued)

OTHER PUBLICATIONS
Gibart, P., "Metal organic vapour phase epitaxy of GaN and lateral overgrowth," Institute of Physics Publishing, Reports on Progress in Physics, vol. 67, Apr. 7, 2004, pp. 667,715.
(Continued)

*Primary Examiner* — Anh Mai
*Assistant Examiner* — Dzung Tran
(74) *Attorney, Agent, or Firm* — Slater & Matsil, L.L.P.

(57) ABSTRACT

In at least one embodiment, the method is designed to produce an optoelectronic semiconductor chip. The method includes at least the following steps in the stated sequence: A) providing a growth substrate with a growth side, B) depositing at least one nucleation layer based on $Al_xGa_{1-x}O_yN_{1-y}$ on the growth side, C) depositing and structuring a masking layer, D) optionally growing a GaN-based seed layer in regions on the nucleation layer not covered by the masking layer, E) partially removing the nucleation layer and/or the seed layer in regions not covered by the masking layer or applying a second masking layer on the nucleation layer or on the seed layer in the regions not covered by the masking layer, and F) growing an AlInGaN-based semiconductor layer sequence with at least one active layer.

14 Claims, 5 Drawing Sheets

(51) Int. Cl.
*H01L 21/00* (2006.01)
*H01L 21/20* (2006.01)
*H01L 21/02* (2006.01)
*H01L 33/32* (2010.01)
*H01L 33/10* (2010.01)

(52) U.S. Cl.
CPC .... *H01L21/02458* (2013.01); *H01L 21/02645* (2013.01); *H01L 21/02647* (2013.01); *H01L 33/10* (2013.01); *H01L 33/32* (2013.01)

(56) References Cited

U.S. PATENT DOCUMENTS

| | | | |
|---|---|---|---|
| 2005/0202682 A1* | 9/2005 | Kiyoku et al. | 438/762 |
| 2009/0091002 A1* | 4/2009 | Arena et al. | 257/623 |
| 2009/0298214 A1 | 12/2009 | Paek et al. | |
| 2010/0093123 A1* | 4/2010 | Cho et al. | 438/42 |
| 2010/0117057 A1* | 5/2010 | Noh et al. | 257/13 |
| 2010/0163839 A1* | 7/2010 | Wuu et al. | 257/9 |
| 2011/0127544 A1* | 6/2011 | Paskova et al. | 257/77 |
| 2011/0134954 A1* | 6/2011 | Letertre | 372/50.11 |
| 2011/0212559 A1 | 9/2011 | Ohmae et al. | |
| 2012/0112158 A1 | 5/2012 | Chyan et al. | |
| 2012/0187443 A1 | 7/2012 | Tsang | |
| 2014/0342484 A1 | 11/2014 | Hertkorn et al. | |
| 2014/0346541 A1 | 11/2014 | Hertkorn et al. | |

FOREIGN PATENT DOCUMENTS

| | | |
|---|---|---|
| DE | 102011114671 A1 | 4/2013 |
| DE | 102012101211 A1 | 8/2013 |
| DE | 102012102148 A1 | 9/2013 |
| EP | 1501117 A1 | 1/2005 |
| EP | 1806790 A2 | 7/2007 |
| EP | 2343742 A2 | 7/2011 |
| WO | 03054939 A1 | 7/2003 |

OTHER PUBLICATIONS

Hiramatsu, K., et al., "Fabrication and characterization of low defect density GaN using facet-controlled epitaxial lateral overgrowth (FACELO)," Journal of Crystal Growth, vol. 221, Dec. 2000, pp. 316-326.

Sumiya, M., et al., "Reduction of defect density in GaN epilayer having buried Ga metal by MOCVD," Journal of Crystal Growth, vol. 237-239, Apr. 2002, pp. 1060-1064.

* cited by examiner

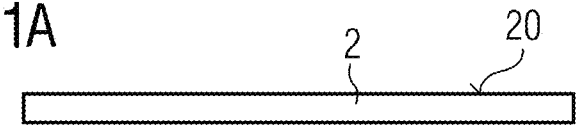
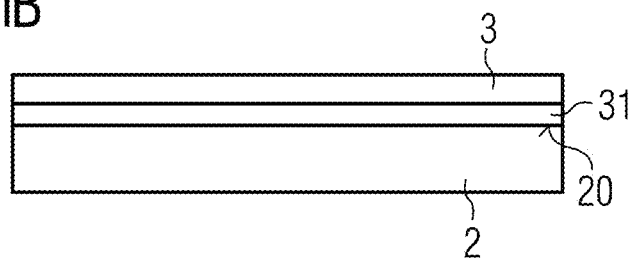
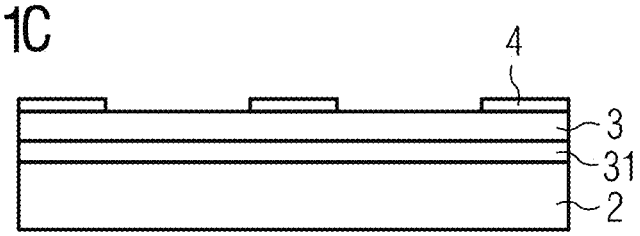
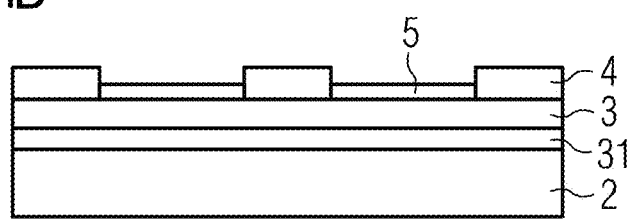
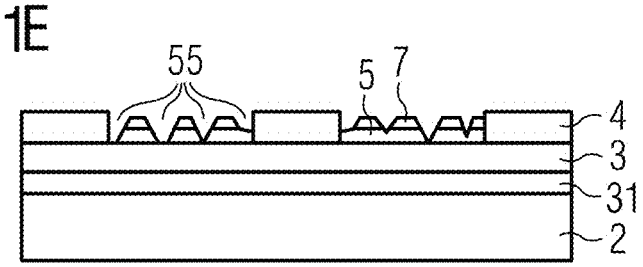

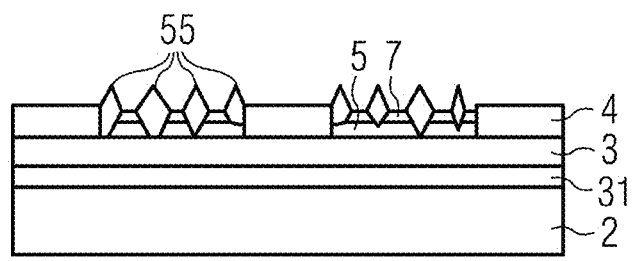
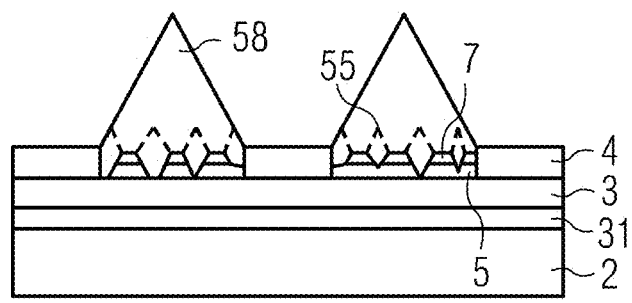
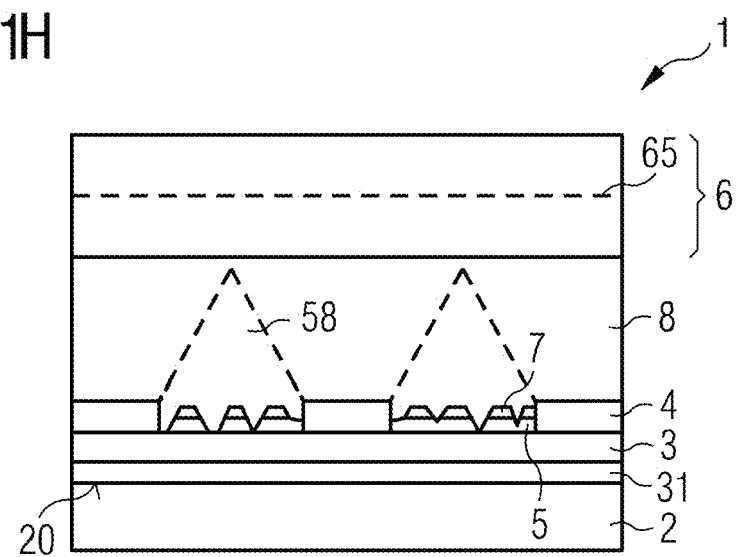

METHOD FOR PRODUCING AN OPTOELECTRONIC SEMICONDUCTOR CHIP AND OPTOELECTRONIC SEMICONDUCTOR CHIP

This patent application is a national phase filing under section 371 of PCT/EP2013/062022, filed Jun. 11, 2013, which claims the priority of German patent application 10 2012 107 001.6, filed Jul. 31, 2012, each of which is incorporated herein by reference in its entirety.

TECHNICAL FIELD

A method is specified for producing an optoelectronic semiconductor chip. An optoelectronic semiconductor chip is additionally specified.

SUMMARY

Embodiments of the present invention specify a method for producing an optoelectronic semiconductor chip with which a high-quality semiconductor layer sequence may be produced.

According to at least one embodiment, the method comprises the step of providing a growth substrate. The growth substrate comprises a sapphire substrate, for example. Other substrates, for instance of silicon, silicon carbide, gallium nitride, gallium arsenide or gallium phosphide, may likewise be used. The growth substrate comprises a growth side, which is designed to have a semiconductor layer sequence deposited, for instance epitaxially, thereon.

According to at least one embodiment, the method comprises the step of growing or applying at least one nucleation layer on the growth side. The nucleation layer may be grown directly on the growth side, such that the growth side and the nucleation layer are in contact. It is likewise possible for a buffer layer to be applied in particular directly between the growth side and the nucleation layer. The nucleation layer is produced, for example, by sputtering or epitaxial growth.

According to at least one embodiment, the nucleation layer is based on $Al_xGa_{1-x}O_yN_{1-y}$. In this case, $0<x\leq1$ and $0\leq y<1$. Preferably $y\leq0.15$ or $y\leq0.05$ or $y\leq0.025$. Furthermore, preferably $y\geq0.1$ or $y\geq0.2$ or $y\geq0.3$ or $y\geq0.5$ or $y\geq0.8$. In particular, the nucleation layer is an aluminum nitride layer or an aluminum oxynitride layer. The nucleation layer may be of an identical material composition over the entire thickness, within the bounds of manufacturing tolerances, or indeed be of varying material composition.

According to at least one embodiment, the method comprises the step of growing or applying a masking layer. The masking layer is preferably produced directly on the nucleation layer. The masking layer preferably comprises one or more of the following stated materials or consists of one or more of these materials: a silicon nitride, a silicon oxide, a silicon oxynitride, a boron nitride, a magnesium oxide.

According to at least one embodiment of the method, the masking layer is structured. Structuring preferably proceeds by photo technique and lithographically. When structuring the masking layer, a material of the previously applied masking layer is removed. It is likewise alternatively possible for the masking layer to be applied already structured. If a material of the masking layer is removed, the nucleation layer is preferably unaffected or substantially unaffected thereby.

According to at least one embodiment, the method optionally comprises the step of growing a gallium nitride-based seed layer. The seed layer is applied in particular directly onto the nucleation layer in those regions which are not covered by the masking layer.

The term "based" may mean that the essential crystal components are in each case formed from the stated materials. Further substances may likewise be present in small concentrations, in particular as doping.

According to at least one embodiment, the method comprises the step of partly removing the nucleation layer and/or the seed layer in regions not covered by the masking layer. In other words, the nucleation layer and/or the seed layer is then partially etched back. Alternatively or in addition, it is possible for a further, thinner masking layer to be grown onto the nucleation layer or onto the seed layer, for example, without any appreciable material removal taking place from the nucleation layer or from the seed layer.

According to at least one embodiment, the method comprises the step of growing an $Al_nIn_{1-n-m}Ga_mN$-based semiconductor layer sequence, wherein $0\leq n\leq 1$, $0\leq m\leq 1$ and $n+m\leq 1$. The semiconductor layer sequence comprises one or more active layers.

According to at least one embodiment, the method serves to produce an optoelectronic semiconductor chip. The semiconductor chip to be produced in particular comprises a light-emitting diode chip, a laser diode chip or indeed a photodiode.

In at least one embodiment, the method is designed to produce an optoelectronic semiconductor chip such as a light-emitting diode. The method comprises at least the following steps, preferably in the stated sequence:

A) providing a growth substrate with a growth side,

B) applying and/or growing at least one nucleation layer on the growth side, wherein the nucleation layer is based on $Al_xGa_{1-x}O_yN_{1-y}$, C) applying and/or growing a first masking layer on the nucleation layer and structuring the first masking layer, D) applying and/or growing a GaN-based seed layer in regions on the nucleation layer not covered by the first masking layer, E) partially removing the nucleation layer and/or the seed layer in regions not covered by the first masking layer and/or applying or growing a second masking layer on the nucleation layer or on the seed layer in the regions not covered by the first masking layer, and F) growing an AlInGaN-based semiconductor layer sequence with at least one active layer.

Step D) is optional here.

In conventional production methods for optoelectronic semiconductor chips, a monocrystalline substrate is conventionally used as the growth substrate for epitaxy. To reduce defect density or to enable better light outcoupling, a structured masking layer is applied to such a substrate prior to epitaxial growth of a semiconductor layer sequence with an active layer. Only at points where the masking layer comprises openings can the semiconductor layer sequence grow. This punctiform growth and subsequent coalescence of the semiconductor layer sequence achieves a distinct improvement in the crystal quality of the semiconductor layer sequence. Such a process is also known as Facet Assisted Epitaxial Lateral Overgrowth, or FACELO for short.

In the case of such overgrowth with such a masking layer, however, severe crystal strain may occur in the semiconductor layer, which may in particular lead to undesired deformation of the growth substrate during epitaxy. This may lead to cracking in the semiconductor layer sequence or indeed result in the active layer displaying marked emission wavelength dispersion over the growth substrate.

Through the partial etching back of the nucleation layer and/or the seed layer and/or through growth of a second masking layer onto the nucleation layer and/or onto the seed layer, such crystal strain may be reduced in the semiconductor layer sequence to be produced. In this way, deformation of the growth substrate during epitaxy can be controlled and more uniform growth of the semiconductor layer sequence is possible.

According to at least one embodiment of the method, the individual layers are produced by means of epitaxy, for instance with organometallic vapor deposition, or by means of sputtering. In particular, the nucleation layer and the masking layer may be produced by means of sputtering. The semiconductor layer sequence and the seed layer are preferably formed by means of epitaxy.

According to at least one embodiment, step D) is performed. This means the seed layer is then produced in particular directly on the nucleation layer.

According to at least one embodiment, partial removal of the seed layer proceeds in step E) with the addition of a reactant gas for hydrogen and preferably with the addition of a reactant gas for nitrogen. The reactant gas for nitrogen is in particular $NH_3$ or $N_2H_4$. The reactant gas for hydrogen may be $H_2$ or also $SiH_4$.

According to at least one embodiment, the second masking layer is a nitride mask. The nitride mask is in particular a silicon nitride layer. The nitride mask is produced from a reactant gas for silicon and a reactant gas for nitrogen. Production of the nitride mask takes place in step E).

According to at least one embodiment, partial material removal of the seed layer and/or of the nucleation layer takes place on production of the nitride mask, in particular through the addition of the reactant gas for hydrogen and/or of the reactant gas for silicon, wherein these two reactant gases may be formed by the same gas. In other words, etching back of the seed layer and/or of the nucleation layer is achieved simultaneously by production of the nitride mask.

According to at least one embodiment, when viewed in plan view the degree of nitride mask coverage on the seed layer and/or on the nucleation layer in regions which, in plan view onto the seed side, are not covered by the masking layer, is at least 50% or at least 60%. Alternatively or in addition, this degree of coverage is at most 90% or at most 80%. In particular, the degree of coverage is between 65% and 75% inclusive.

According to at least one embodiment, in step E) material is only or substantially only removed from the seed layer and not from the nucleation layer. This does not necessarily exclude individual atoms from being released from the nucleation layer at a top of the nucleation layer remote from the growth substrate. However, in step E) the nucleation layer is retained in thickness and structure. Material removal is limited to the seed layer.

According to at least one embodiment, the nitride mask, which corresponds to the second masking layer, is applied exclusively or substantially only on the seed layer and not on the nucleation layer. The nitride mask may here cover the masking layer located preferably directly on the nucleation layer. In particular, it is possible for a material of the seed layer to be removed in step E) only to the extent that the nucleation layer thereunder is not exposed.

According to at least one embodiment, a thickness of the nitride mask is below the thickness of the masking layer by at least a factor of 50 or at least a factor of 100. For example, the thickness of the nitride mask amounts to at most 2.0 nm or at most 1.0 nm or at most 0.5 nm. The thickness of the masking layer is, for example, at least 25 nm or at least 50 nm or at least 100 nm. Alternatively or in addition, the thickness or the average thickness of the nitride mask is between one and three atomic layers inclusive. A degree of coverage with the nitride mask, when viewed in plan view, is here preferably between 50% and 85% inclusive, in particular around 70%.

According to at least one embodiment, the partial removal of the seed layer and/or of the nucleation layer in step E) proceeds through a lack of the reactant gas for nitrogen. At comparatively high temperatures and with too little available nitrogen, already crystallized gallium nitride decomposes. No separate etchant is thus then used for etching back the seed layer and/or the nucleation layer. In particular, etching back then proceeds without the addition of a reactant gas for hydrogen and/or for silicon or for another etching-back substance.

According to at least one embodiment, in step E) a multiplicity of seed islands is formed in regions on the nucleation layer and/or on the seed layer not covered by the masking layer. The seed islands are designed such that semiconductor material grows from these seed islands. The seed islands are in particular formed by exposed sides of the nucleation layer and/or the seed layer. In particular, the seed islands are those regions of the nucleation layer and/or the seed layer which are not covered by the nitride mask.

According to at least one embodiment, the seed islands have an average diameter of at least 10 nm or of at least 15 nm or of at least 25 nm. Alternatively or in addition, the average diameter of the seed islands amounts to at most 250 nm or at most 150 nm or at most 80 nm.

According to at least one embodiment, the seed islands have an average structure size, when viewed in plan view onto the growth side, which is smaller at least by a factor of 10 or at least by a factor of 20 or at least by a factor of 50 than a corresponding structure size of the masking layer. For example, the structure size of the seed islands is on the nanometer scale and the structure size of the masking layer is on the micrometer scale.

According to at least one embodiment, the method comprises a step E1). In step E1) epitaxial lateral overgrowth of smaller structures into larger, cross-sectionally triangular or trapezoidal structures takes place, starting from the seed islands. In other words, in each case lateral overgrowth begins at the seed islands. In particular, firstly a multiplicity of small, separate pyramid-like structures forms. These relatively small pyramid structures starting from the respective seed islands then grow together in the course of the method to form a larger structure. In plan view onto the growth side, this larger structure is substantially restricted to those regions which are not covered by the masking layer.

According to at least one embodiment, in step E1) a vertical growth rate is greater than a horizontal growth rate. The vertical growth rate here denotes the growth in the direction perpendicular to the growth side and the horizontal growth rate growth parallel to the growth side. For example, the vertical growth rate exceeds the horizontal growth rate by at least a factor of 1.5 or by at least a factor of 2 and/or by at most a factor of 5 or by at most a factor of 4.

According to at least one embodiment, the method comprises a step E2), which follows step E1) and/or step E). In step E2) epitaxial lateral overgrowth proceeds until a continuous coalescence layer is produced. The coalescence layer is preferably a contiguous, hole-free layer. The coalescence layer preferably covers the entire growth side of the growth substrate.

According to at least one embodiment, in step E2) the horizontal growth rate surpasses the vertical growth rate, for example, by at least a factor of 1.25 or at least a factor of 1.5.

According to at least one embodiment, step E1) and/or step E2) is performed after step E) and before step F).

According to at least one embodiment, the masking layer comprises a plurality of layers, for instance at least or precisely two or at least or precisely three layers.

According to at least one embodiment, a middle layer of the masking layer is formed from silicon nitride. Preferably, this middle layer is flanked on both sides in each case by layers of silicon oxide. The silicon oxide layers preferably directly adjoin the silicon nitride layer.

According to at least one embodiment, the layer of silicon nitride serves as a predetermined breaking point on detachment of the semiconductor layer sequence from the growth substrate. Likewise, the nitride mask in the regions not covered by the masking layer may serve as a predetermined breaking point. Detachment from the semiconductor layer sequence here preferably takes the form of a laser lift-off method.

According to at least one embodiment, the masking layer is formed by a multiplicity of masking islands. The masking islands are preferably discoid regions, which have a circular, hexagonal or octagonal basic shape when viewed in plan view.

According to at least one embodiment, an average diameter of the masking islands amounts to at least 0.5 µm or at least 0.8 µm or at least 1.0 µm. Alternatively or in addition, the average diameter is at most 7.5 µm or at most 5 µm or at most 4 µm.

According to at least one embodiment, the masking islands have an average distance from one another of at least 0.5 µm or at least 1 µm or at least 2 µm. Alternatively or in addition, this distance is at most 10 µm or at most 7.5 µm.

According to at least one embodiment, the nucleation layer is a layer of a Bragg mirror remote from the growth substrate. For example, the Bragg mirror is formed alternately from layers of aluminum nitride and layers with silicon, in particular silicon oxide or silicon nitride. The Bragg mirror may be applied directly onto the growth side.

According to at least one embodiment, the following layers follow one another directly and in the stated sequence in regions not covered by the masking layer: the growth substrate, the nucleation layer, the seed layer, the nitride mask, the coalescence layer and the semiconductor layer sequence. In the regions covered by the masking layer, the masking layer is preferably located directly between the nucleation layer and the coalescence layer.

An optoelectronic semiconductor chip is additionally provided. The semiconductor chip is produced in particular using a method as described in conjunction with one or more of the above-stated embodiments. Features of the method are therefore also disclosed for the optoelectronic semiconductor chip and vice versa.

In at least one embodiment, the optoelectronic semiconductor chip, which is in particular a light-emitting diode chip, comprises a growth substrate with a growth side. On the growth side there is located a nucleation layer, wherein the nucleation layer is based on $Al_xGa_{1-x}O_yN_{1-y}$. On a side of the nucleation layer remote from the growth substrate there is located a masking layer. On a side of the masking layer remote from the growth substrate, a semiconductor layer sequence based on $Al_nIn_{1-n-m}Ga_mN$ with at least one active layer is produced. In regions which, when viewed in plan view onto the growth side, are not covered by the masking layer, a nitride mask is located between the nucleation layer and the semiconductor layer sequence.

BRIEF DESCRIPTION OF THE DRAWINGS

A method described here and a semiconductor chip described here will be explained in greater detail below with reference to the drawings and with the aid of exemplary embodiments. Elements which are the same in the individual figures are indicated with the same reference numerals. The relationships between the elements are not shown to scale, but rather individual elements may be shown exaggeratedly large to assist in understanding.

In the drawings:

FIGS. 1A-1H, 3 and 4 are schematic representations of exemplary embodiments of methods described here;

DETAILED DESCRIPTION OF ILLUSTRATIVE EMBODIMENTS

Figure 2A:
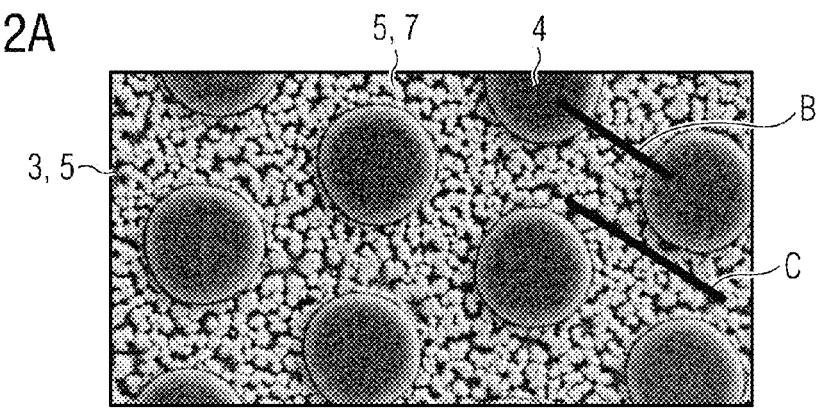
FIG. 2A-2C is a schematic plan view onto a growth side in a method described here.

FIGS. 1A to 1H shows in schematic sectional representations an exemplary embodiment of a method for producing an optoelectronic semiconductor chip 1. According to FIG. 1A a growth substrate 2 is provided with a growth side 20. The growth substrate 2 in particular comprises a sapphire substrate.

According to FIG. 1B, a nucleation layer 3 is produced on the growth side 20. The nucleation layer 3 is, for example, an aluminum nitride layer. The nucleation layer 3 may contain small amounts of oxygen. In particular, an oxygen content decreases monotonically or strictly monotonically away from the growth substrate 2. Likewise, the nucleation layer 3 may be an AlGaN layer. A gallium content in the nucleation layer 3 may increase away from the growth substrate 2. The nucleation layer 3 preferably has a thickness of between 10 nm and 3000 nm inclusive, in particular between 20 nm and 200 nm inclusive. It is additionally possible for the nucleation layer 3 to comprise a plurality of sublayers. For example, the nucleation layer 3 is produced using epitaxy, for instance MOVPE, HVPE or MBE or indeed using sputtering.

A buffer layer 31 is optionally located between the nucleation layer 3 and the growth substrate 2. Unlike in the illustration, the nucleation layer 3 may also be produced directly on the growth side 20.

In the method step according to FIG. 1C, a masking layer 4 is applied, preferably directly, onto the nucleation layer 3 and structured. The masking layer 4 comprises a multiplicity of masking islands, which have a diameter of preferably less than 5 µm, in particular around 2 µm, see also FIG. 2A. A distance between adjacent masking islands is, for example, roughly 1 µm. A thickness of the masking islands amounts, for example, to around 200 nm. The masking layer 4 is formed by a silicon oxide layer, followed by a silicon nitride layer and by a further silicon oxide layer. Such masking layers are also mentioned in document DE 10 2011 012 608 A1, the disclosure content of which is included by reference.

FIG. 1D shows that in regions not covered by the masking layer 4 a seed layer 5 is deposited directly onto the nucleation layer 3. The seed layer 5 is a group III-V nitride layer, preferably a doped or undoped GaN layer. The seed layer 5 comprises, for example, a thickness of at least 10 nm or of at least 20 nm or of at least 50 nm. Alternatively or in addition, the thickness of the seed layer 5 is at most 300 nm or at most 200 nm. Preferably, the thickness of the seed layer 5 is less than the thickness of the masking layer 4 by at least a factor of 2 or at least a factor of 5.

In the method step according to FIG. 1E, a reactant gas for hydrogen is added, preferably $SiH_4$. The seed layer 5 is etched back thereby. Addition of the reactant gas for hydrogen may take place with or without the addition of a reactant gas for nitrogen. Preferably, however, a reactant gas for nitrogen, for example, NH$_3$, is also added.

In this case, a nitride mask 7 forms in places on the seed layer 5. A degree of coverage of the seed layer 5 by the nitride mask 7 is preferably between 50% and 90% inclusive. The nitride mask 7 is preferably only thin. The regions of the seed layer 5 not covered by the nitride mask 7 form growth islands 55. The growth islands 55 have dimensions in the nanometer range. A nitride mask 7 produced in this way may also be known as an in situ mask.

FIG. 1F shows that lateral overgrowth starts from the growth islands 55. Starting from the growth islands 55, cross-sectionally triangular, rhombical (also referred to as diamond-shaped) or trapezoidal regions are formed. A material of the regions grown out of the seed islands 55 is preferably GaN.

According to FIG. 1G, lateral overgrowth is continued, such that cross-sectionally larger, triangular growth structures 58 are formed. The smaller regions formed from the growth islands 55, which grow together to form the growth structures 58, are symbolized in FIG. 1G as dashed lines.

In FIG. 1H, starting from the growth structures 58, lateral overgrowth proceeds to form a coalescence layer 8 which covers the entire growth side 20. A semiconductor layer sequence 6 with at least one active layer 65 is deposited on the coalescence layer 8.

A method as performed in association with FIGS. 1A to 1H preferably proceeds with the following stated method parameters: a 50 nm thick aluminum nitride layer is applied by sputtering as a nucleation layer 3 to a 6 inch sapphire substrate as growth substrate 2. A masking layer 4 consisting of the layer sequence silicon oxide-silicon nitride-silicon oxide is sputtered onto the nucleation layer 3 with thicknesses of 100 nm, 50 nm and 100 nm. The masking layer 4 is then structured photolithographically, with masking islands with a diameter of roughly 2 μm and a spacing of roughly 1 μm being produced. The regions masked by the masking layer 4 are approximately regular octagons.

In a MOVPE installation, an approximately 90 nm thick, undoped GaN layer is then deposited in the openings between the masking islands as a seed layer 5. In a further process step, a reactant gas for gallium, in particular trimethylgallium, is stopped and SiH$_4$ is introduced into the epitaxy reactor. An N$_2$/H$_2$/NH$_3$ environment then preferably prevails, additionally with SiH$_4$. During this etching back, silicon nitride is deposited for the nitride mask 7. Deposition of the nitride mask 7 and etching back of the seed layer 5 are concurrent processes. Etching back takes around five minutes.

Then, the growth conditions for gallium nitride are selected such that the cross-sectionally triangular growth structures 58 form. At this point, the reactant gas for hydrogen and for silicon is closed off again. After deposition of the growth structures 58, the coalescence layer 8 is produced, such that a 2D GaN layer is obtained, which has laterally overgrown the masking layer 4. A dislocation density of the coalescence layer 8 is then less than $10^8$ per square centimeter. The semiconductor layer sequence 6 is deposited onto this planar coalescence layer 8. The coalescence layer 8 is doped or undoped gallium nitride.

Appropriate growth conditions for gallium nitride are revealed in the article by Hiramatsu et al. in Journal of Crystal Growth, vol. 221, pages 316 to 326 dating from the year 2000, and the article by Gibart in Reports on Progress in Physics, vol. 67, pages 667 to 715 dating from 2004. The disclosure content of these articles is included by reference.

Figure 2B:
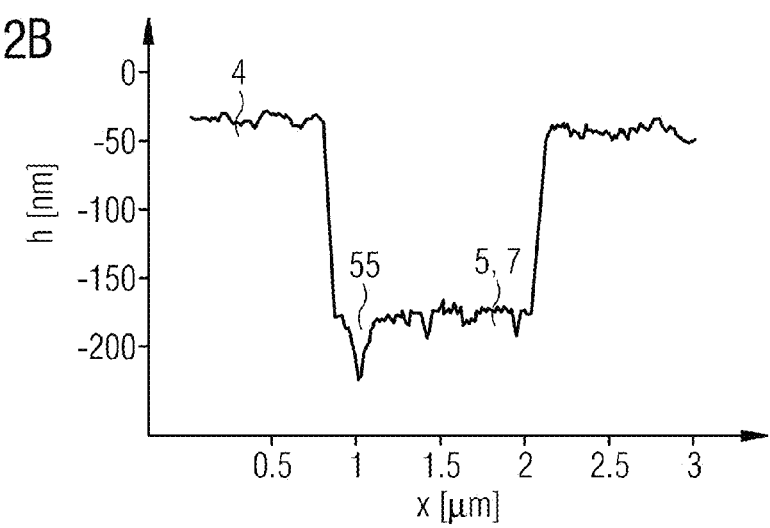
Figure 2C:
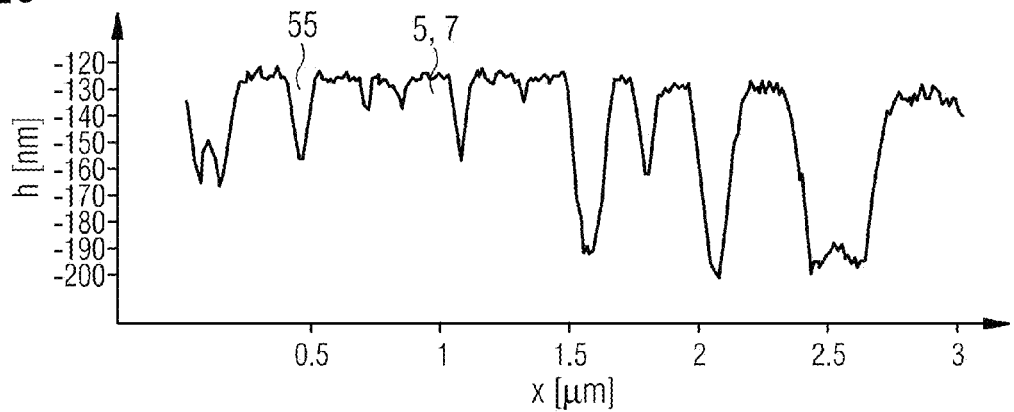

FIG. 2A is a plan view onto the growth side 20 after the method step according to FIG. 1E. A sectional representation along line B is shown in FIG. 2B, and along line C in FIG. 2C, a height h in nm being plotted along a section line x in μm. FIG. 2C is thus an enlarged representation of a portion corresponding to the middle region in FIG. 2B.

The masking islands of the masking layer 4 are visible in FIG. 2B as distinct elevated portions. Recesses in the seed layer 5 formed by the etching back have dimensions in the x direction in the range of roughly 100 nm. These recesses, which form the seed islands 55, may extend into the nucleation layer 3 or indeed as far as the growth side 20. The recesses are randomly distributed and formed irregularly. By such seed islands 55 strain arising during growth of the semiconductor layer sequence 6 may be controlled.

A mechanism which leads to this reduction in strain may be explained as follows: aluminum-containing layers such as AlGaN or AlN or AlON have a smaller lattice constant than GaN. GaN accordingly grows on such layers typically under compressive strain. This compressive strain leads, during epitaxy, to deformation of the growth substrate 2 and the semiconductor layer sequence 6 produced thereon. The etching back of the seed layer 5 results in GaN nano islands. The seed layer 5 is thus laterally no longer continuous. This allows lateral relaxation of the seed layer 5. The degree of relaxation, determined by the size of the GaN nano islands of the seed layer 5, may be adjusted approximately via the thickness of the seed layer 5 and/or via the duration of etching back. The greater the degree of etching back and/or the thinner the seed layer 5, the less severe is the deformation of the growth substrate 2 during epitaxial production of the semiconductor layer sequence 6.

Figure 3:
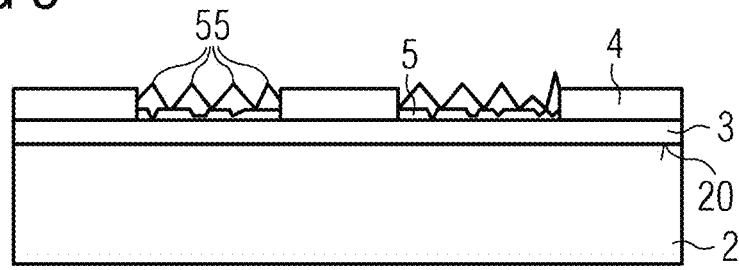

In the exemplary embodiment according to FIG. 3, etching back of the seed layer 5 proceeds without the addition of a reactant gas for silicon. Accordingly, no nitride mask forms.

Figure 4:
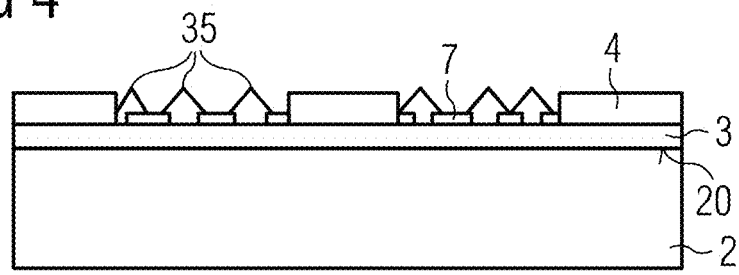

According to FIG. 4, the nitride mask 7 is applied directly onto the nucleation layer 3. In the exemplary embodiment of the method according to FIG. 4, no seed layer 5 is thus present. The seed islands 35 are formed by a material of the nucleation layer 3.

Figure 5:
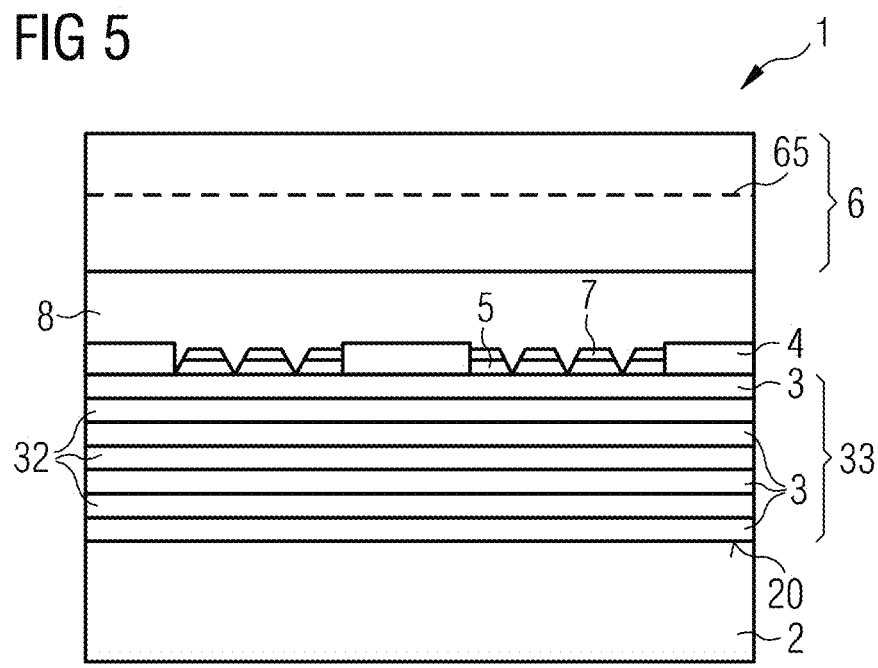
FIGS. 5 to 7 are schematic sectional representations of exemplary embodiments of optoelectronic semiconductor chips described here.

FIG. 5 shows an exemplary embodiment of the semiconductor chip 1. The nucleation layer 3 is here part of a Bragg mirror 33, comprising a plurality of the nucleation layers 3 formed of aluminum nitride. Layers 32 of silicon dioxide or of silicon nitride are located between each of the aluminum nitride layers 3. In the exemplary embodiment according to FIG. 5 the growth substrate 2 remains on the finished semiconductor chip 1.

Figure 6:
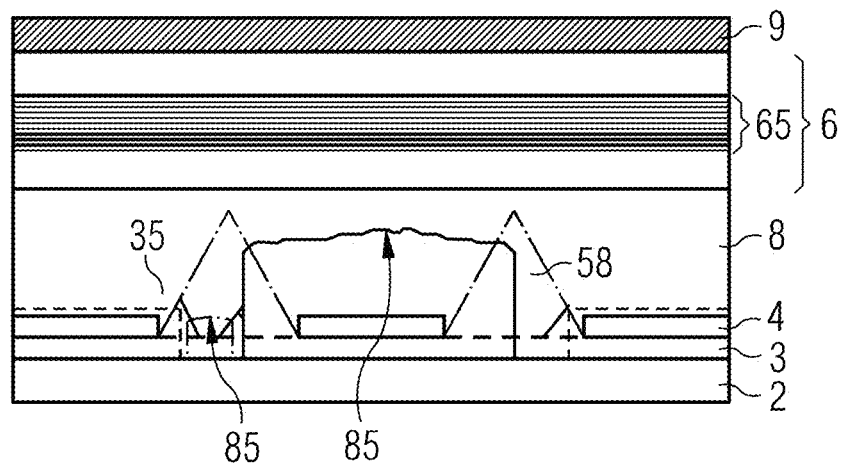

FIG. 6 shows that a carrier substrate 9, for example, of silicon, is applied to the semiconductor layer sequence 6. Removal of the semiconductor layer sequence 6 with the active layer 65 formed as a multiple quantum well structure is not shown in FIG. 6.

FIG. 6 additionally schematically shows defect reduction, by means of the illustrated crystal defects 85. These crystal defects 85, in particular dislocations, in each case bend away at lateral boundary faces of the growth structures 58 and of the structures formed from the seed islands 35, 55. Due to the multiplicity of seed islands 35, 55, efficient defect reduction may thus already be achieved within the growth structures 58.

After production of the growth structures 58 and before, during and/or after production of the coalescence layer 8 of GaN, an AlGaN layer, not shown, may additionally be grown, as also in all the other exemplary embodiments. A thickness of this AlGaN layer preferably amounts to at least 1 nm or 5 nm and/or at most 100 nm or 50 nm. An Al content of this AlGaN layer additionally preferably amounts to at least 1% or 5% or 20% and/or at most 100% or 85% or 60%. This AlGaN layer is preferably undoped, but may also be doped.

It is possible for this AlGaN layer to nucleate directly on the masking layer 4. This AlGaN layer may thus be in direct contact with the masking layer 4 and/or with the coalescence layer 8 and/or with the growth structures 58. This AlGaN layer may likewise be grown within the coalescence layer 8. This AlGaN layer may additionally be a continuous, uninterrupted layer, such that the growth structures 58 are overgrown by this AlGaN layer, or this AlGaN layer is a layer through which the growth structures 58 penetrate and beyond which the growth structures 58 project, in a direction away from the growth substrate 2.

Figure 7:
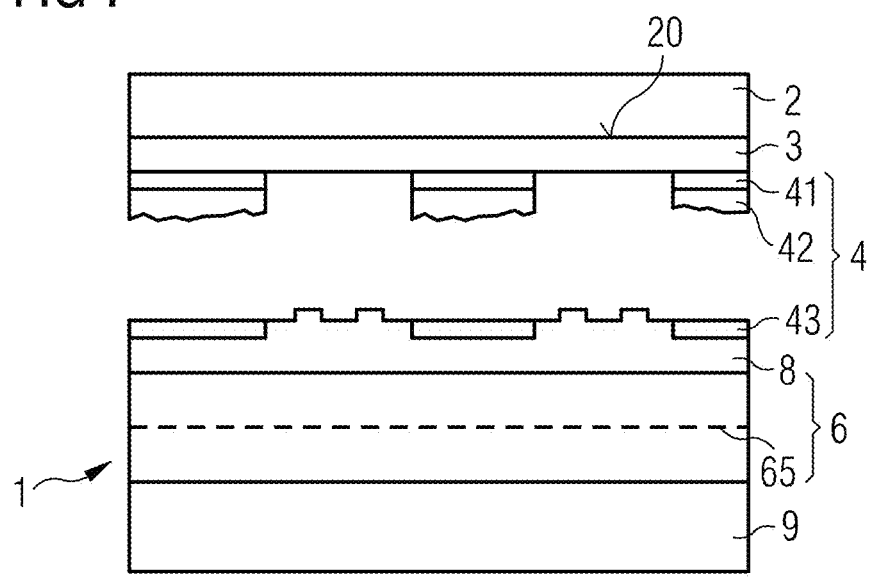

FIG. 7 is a schematic illustration of detachment of the growth substrate 2 from the semiconductor layer sequence 6. Detachment proceeds in particular by a laser lift-off method. Laser radiation, which is passed through the growth substrate 2, is absorbed in the gallium nitride layer. The nucleation layer 3 of aluminum nitride is retained in this way. The silicon nitride layer 42, located between silicon dioxide layers 41, 43 of the masking layer 4, in this case acts as a predetermined breaking point.

The nucleation layer 3 of aluminum nitride and the first layer 41 of silicon oxide remain on the sapphire growth substrate 2. The layer 43 of silicon oxide remaining on the semiconductor layer sequence 6 may serve as a hard mask for the production of structured light outcoupling structures. Corresponding outcoupling structures for light outcoupling may also be produced on the semiconductor layer sequence 6 in all the other exemplary embodiments.

The silicon dioxide layer 41 may then be detached from the growth substrate 2. This enables repeated use of the growth substrate 2 with the nucleation layer 3, in each case after fresh application of a masking layer 4.

The invention described here is not restricted by the description given with reference to the exemplary embodiments. Rather, the invention encompasses any novel feature and combination of features, including in particular any combination of features in the claims, even if this feature or this combination is not itself explicitly indicated in the claims or exemplary embodiments.

The invention claimed is:

1. A method for producing an optoelectronic semiconductor chip, the method comprising:
    providing a growth substrate with a growth side;
    depositing a nucleation layer on the growth side, wherein the nucleation layer is based on $Al_xGa_{1-x}O_yN_{1-y}$ with $0 < x \leq 1$ and $0 \leq y < 1$;
    depositing a first masking layer on the nucleation layer;
    structuring the first masking layer;
    growing a GaN-based seed layer only on the nucleation layer in regions not covered by the first masking layer;
    partially removing the seed layer in regions not covered by first the masking layer, and applying a second masking layer onto the seed layer in regions not covered by the first masking layer such that, when seen in top view, the second masking layer covers the seed layer only in part, and wherein regions of the seed layer not covered by the second masking layer form growth islands;
    forming cross-sectionally triangular, rhombical or trapezoidal regions starting from the growth islands;
    performing lateral overgrowth, continuing from the forming the cross-sectionally triangular, rhombical or trapezoidal regions and such that cross-sectionally larger, triangular growth structures are formed beginning from the cross-sectionally triangular, rhombical or trapezoidal regions;
    laterally overgrowing the growth structures to form a coalescence layer which covers the entire growth side; and
    growing, on the coalescence layer, an AlInGaN-based semiconductor layer sequence with at least one active layer;
    wherein the individual steps are performed in the stated sequence.

2. The method according to claim 1, wherein partially removing the seed layer comprises using a reactant gas for hydrogen and with the addition of a reactant gas for nitrogen.

3. The method according to claim 1, wherein the partial removal of the seed layer is effected through a lack of a reactant gas for nitrogen.

4. The method according to claim 1, wherein the second masking layer comprises a silicon nitride layer, wherein a reactant gas for silicon is added when partially removing the nucleation layer or the seed layer, and wherein a degree of coverage of the second masking layer on the seed layer is between 50% and 90% inclusive.

5. The method according to claim 4, wherein a thickness of the second masking layer is between one and three atomic layers inclusive and wherein no material is removed from the nucleation layer.

6. The method according to claim 1, wherein the partially removing the seed layer and applying the second mask layer comprises forming a plurality of seed islands from the seed layer that are not covered by the first masking layer, wherein the seed islands have an average diameter of between 15 nm and 150 nm inclusive and are based on GaN.

7. The method according to claim 1, wherein the growth substrate is a sapphire substrate and wherein the components stated below follow one another directly and in the stated sequence in regions not covered by the first masking layer, wherein the masking layer is applied directly onto the nucleation layer:
    the growth substrate,
    the nucleation layer,
    the seed layer,
    the nitride mask,
    the coalescence layer, and
    the semiconductor layer sequence.

8. The method according to claim 1, wherein depositing the first masking layer comprises depositing a masking layer of multilayer construction, wherein a middle layer of silicon nitride adjoins a layer of a silicon oxide on both sides.

9. The method according to claim 8, wherein the layer of silicon nitride serves as a predetermined breaking point on detachment of the semiconductor layer sequence from the growth substrate, wherein detachment comprises a laser lift-off method.

10. The method according to claim 1, wherein the first masking layer is formed by a plurality of masking islands of a material of the first masking layer, wherein an average diameter of the masking islands is between 0.5 μm and 5 μm inclusive and an average distance between adjacent masking islands amounts to between 0.5 μm and 10 μm inclusive.

11. The method according to claim 1, wherein the nucleation layer is a layer of a Bragg mirror remote from the growth substrate, wherein the Bragg mirror is formed from alternating layers of AlN and layers with silicon.

12. The method according to claim 1, wherein the second masking layer comprises a nitride mask.

13. An optoelectronic semiconductor chip comprising:
    a growth substrate with a growth side;
    a nucleation layer directly on the growth side, wherein the nucleation layer is based on $Al_xGa_{1-x}O_yN_{1-y}$ with $0 < x \leq 1$ and $0 \leq y < 1$;

a first masking layer directly on a side of the nucleation layer remote from the growth substrate, the first masking layer covering the nucleation layer only in part, wherein the first masking layer is made of one of a silicon nitride, a silicon oxide, a silicon oxynitride, a boron nitride or a magnesium oxide;

a seed layer directly on a side of the nucleation layer remote from the growth substrate, wherein the seed layer is based on GaN, and wherein the seed layer is present only in regions of the nucleation layer which are not covered by the first masking layer:

a coalescence layer based on GaN, wherein the coalescence layer is disposed on a side of the first masking layer that is remote from the growth substrate and is further disposed on a side of a second masking layer that that is remote from the growth substrate, wherein the coalescence layer is a contiguous, hole-free layer covering thee entire growth side and that is grown starting from the seed layer; and an AlInGaN-based semiconductor layer sequence with at least one active layer disposed directly on a side of the coalescence layer remote from the growth substrate;

wherein the second masking layer is made of a silicon nitride and is located between the nucleation layer and the coalescence layer, the second masking layer is thinner than the first masking layer and is located on at least the seed layer in regions not covered by the first masking layer such that the second masking layer, when viewed in plan view onto the growth side, is not covered by the first masking layer.

14. A method for producing an optoelectronic semiconductor chip, the method comprising:

providing a growth substrate with a growth side;

depositing a nucleation layer on the growth side, wherein the nucleation layer is based on $Al_xGa_{1-x}O_yN_{1-y}$ with $0 < x \leq 1$ and $0 \leq y < 1$;

depositing a masking layer on the nucleation layer;

structuring the masking layer;

growing a GaN-based seed layer on the nucleation layer in regions of the nucleation layer not covered by the masking layer;

partially removing the seed layer in the regions not covered by the masking layer, wherein the partial removal of the seed layer uses a lack of a reactant gas for nitrogen such that a plurality of seed islands is formed on the nucleation layer in regions not covered by the masking layer and not covered by the seed layer, the seed islands configured such that semiconductor material grows from the seed islands;

forming cross-sectionally triangular, rhombical or trapezoidal regions growing from, and starting from, the seed islands;

performing lateral overgrowth, such that, beginning from the cross-sectionally triangular, rhombical or trapezoidal regions, cross-sectionally larger, triangular growth structures are formed;

lateral overgrowing the growth structures to form a coalescence layer which covers the entire growth side; and growing, on the coalescent layer, an AlInGaN-based semiconductor layer sequence having at least one active layer;

wherein the individual steps are performed in the stated sequence.

* * * * *

UNITED STATES PATENT AND TRADEMARK OFFICE
CERTIFICATE OF CORRECTION

PATENT NO. : 9,293,640 B2  
APPLICATION NO. : 14/418424  
DATED : March 22, 2016  
INVENTOR(S) : Joachim Hertkorn et al.

Page 1 of 1

It is certified that error appears in the above-identified patent and that said Letters Patent is hereby corrected as shown below:

In the Claims

In Col. 9, line 54, claim 1, delete "first the masking layer," and insert --the first masking layer,--.

In Col. 10, line 66, claim 13, delete "AlxGa1-xOyN1-y" and insert --$Al_xGa_{1-x}O_yN_{1-y}$--.

In Col. 11, line 18, claim 13, delete "thee" and insert --the--.

Signed and Sealed this  
Seventh Day of June, 2016

Michelle K. Lee  
*Director of the United States Patent and Trademark Office*